(12) United States Patent
Chen et al.

(10) Patent No.: US 8,760,593 B2
(45) Date of Patent: Jun. 24, 2014

(54) THIN FILM TRANSISTOR AND METHOD FOR MANUFACTURING THEREOF

(75) Inventors: Po-Lin Chen, Hsin-Chu (TW);
Kuo-Yuan Tu, Hsin-Chu (TW);
Wen-Ching Tsai, Hsin-Chu (TW);
Chun-Nan Lin, Hsin-Chu (TW);
Shu-Feng Wu, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 298 days.

(21) Appl. No.: 12/221,615

(22) Filed: Aug. 5, 2008

(65) Prior Publication Data
US 2009/0101903 A1 Apr. 23, 2009

(30) Foreign Application Priority Data
Oct. 22, 2007 (TW) .............................. 96139559 A (51) Int. Cl.
*G02F 1/136* (2006.01)
*H01L 29/04* (2006.01)
*H01L 21/00* (2006.01)

(52) U.S. Cl.
USPC .................................. 349/43; 257/59; 438/34

(58) Field of Classification Search
USPC .................................. 349/43; 257/59; 438/34
See application file for complete search history.

(56) References Cited

U.S. PATENT DOCUMENTS

| 6,255,671 B1 * | 7/2001 | Bojarczuk et al. ............. 257/103 |
| 6,556,257 B2 * | 4/2003 | Ino ................................. 349/43 |
| 6,563,134 B1 * | 5/2003 | Chen et al. ...................... 257/59 |
| 6,621,537 B1 * | 9/2003 | Nakamura et al. .............. 349/43 |
| 7,157,323 B2 | 1/2007 | Gan et al. |
| 7,417,254 B2 | 8/2008 | Fang et al. |
| 7,586,197 B2 | 9/2009 | Lee et al. |
| 2003/0048823 A1 * | 3/2003 | Yamanaka ..................... 372/45 |
| 2003/0071948 A1 * | 4/2003 | Felder et al. .................. 349/122 |
| 2003/0214624 A1 * | 11/2003 | Fujii et al. ..................... 349/158 |

(Continued)

FOREIGN PATENT DOCUMENTS

| TW | 494266 | 7/2002 |
| TW | I254973 | 5/2006 |
| TW | 200707754 | 2/2007 |

OTHER PUBLICATIONS

English language translation of abstract of TW 494266 (published Jul. 11, 2002).

(Continued)

*Primary Examiner* — Jerry Blevins
(74) *Attorney, Agent, or Firm* — McClure, Qualey & Rodack, LLP (57) ABSTRACT

A thin-film transistor (TFT) includes a gate electrode, a gate dielectric layer, a semiconductor layer, source/drain electrodes, a passivation layer and a protection layer. The gate electrode is disposed on a substrate. The gate dielectric layer covers the gate electrode and the substrate. The semiconductor layer is disposed on the gate dielectric layer and above the gate electrode. The semiconductor layer has a channel region disposed above the gate electrode and source/drain regions disposed at both sides of the channel region. The source/drain electrodes are disposed on the source/drain regions of the semiconductor layer and each has a barrier layer disposed on the source/drain regions of the semiconductor layer and a conductive layer disposed on the barrier layer. The passivation layer is disposed over the surface of the source/drain electrodes. The protection layer is disposed over the substrate, the passivation layer, and the channel region of the semiconductor layer.

8 Claims, 5 Drawing Sheets

(56) References Cited

U.S. PATENT DOCUMENTS

2006/0084256 A1* 4/2006 Cabral et al. ............... 438/597
2006/0102894 A1 5/2006 Masuda et al.
2006/0110866 A1 5/2006 Gan et al.
2007/0001170 A1* 1/2007 Jung ............................ 257/59
2007/0085118 A1* 4/2007 Yasuda ....................... 257/291

OTHER PUBLICATIONS

English language translation of abstract of TW I254973 (published May 11, 2006).

English language translation of abstract of TW 200707754 (published Feb. 16, 2007).

* cited by examiner

THIN FILM TRANSISTOR AND METHOD FOR MANUFACTURING THEREOF

This application claims priority to Taiwan Application Serial Number 96139559, filed Oct. 22, 2007, which is herein incorporated by reference.

BACKGROUND

1. Field of Invention

The present invention relates to a flat panel display and particularly to a thin film transistor (TFT) of a flat panel display.

2. Description of Related Art

Copper metal has advantages such as low resistance, low coefficient of thermal expansion, high melting point and good electro-migration resistance capability. Therefore, copper metal may have high potential to be used for electrode structures in a TFT.

However when used on the TFT, copper metal easily reacts with silicon to generate copper silicide, and copper metal has a high diffusion coefficient in the dielectric layer, thus easily resulting in electrical degradation of the TFT. Moreover, the poor adhesion between the copper metal and the dielectric layer easily results in peeling. In order to solve the aforementioned problem, a diffusion barrier layer is additional disposed in the copper electrode TFT structure in addition to copper metal.

In the conventional TFT structure, when copper metal is used in the source/drain electrodes of the TFT, a barrier layer must be formed between the source/drain electrodes and the amorphous silicon layer and the phosphorus doped silicon layer. In this case, the source/drain electrodes of the TFT would not directly contact the amorphous silicon layer and the phosphorus doped silicon layer so that the aforementioned problem of copper silicide generation can be avoided. However, when an oxygen-containing compound (oxide or oxynitride) is used as a barrier layer additional problem can be raised. During the subsequent process, a protection layer is formed by a Plasma Enhanced Chemical Vapor Deposition (PECVD). In this case, the barrier layer formed by the oxygen-containing compound is reduced and damaged by the reacting gas in the PECVD process, thereby producing bubbles and resulting in peeling of the copper film of the source/drain electrodes.

Due to the aforementioned problems, there is a need to provide a TFT structure so that copper electrodes can be used in the TFT structure and would not be damaged during the manufacturing process.

SUMMARY

It is an object of the present invention to provide a TFT for preventing a barrier layer from being damaged during subsequent processes, and alleviating peeling of a copper film of the source/drain electrodes.

According to one aspect of the present invention, a manufacturing method of a TFT is provided. The method comprises first forming a gate electrode on a substrate. Then, a gate dielectric layer is formed to cover the gate electrode and substrate. A patterned semiconductor layer is formed thereafter on the gate dielectric layer above the gate electrode. The patterned semiconductor layer has a channel region disposed above the gate electrode and source/drain regions disposed at both sides of the channel region. Next, source/drain electrodes are formed on the source/drain regions of the patterned semiconductor layer. The source/drain electrodes are treated by nitrogen-containing plasma to form a passivation layer on a surface of the source/drain electrodes. Finally, a protection layer is formed to cover the passivation layer, a portion of the patterned semiconductor layer and the substrate.

According to another aspect of the present invention, a TFT is provided. In one embodiment of the present invention, the TFT is disposed on a substrate. The TFT comprises a gate electrode, a gate dielectric layer, a semiconductor layer, source/drain electrodes, a passivation layer and a protection layer. The gate electrode is disposed on the substrate, and the gate dielectric layer covers the gate electrode and the substrate. The semiconductor layer is disposed on the gate dielectric layer above the gate electrode. The semiconductor layer has a channel region disposed over the gate electrode and source/drain regions disposed at both sides of the channel region. The source/drain electrodes are disposed on the source/drain regions of the semiconductor layer. Each of the source/drain electrodes comprises a barrier layer and a conductive layer, wherein the barrier layer is disposed on the source/drain regions of the semiconductor layer, and the conductive layer is disposed on the barrier layer. The passivation layer is disposed over the surface of the source/drain electrodes. The protection layer is disposed over the passivation layer, the channel region of the semiconductor layer, and the substrate.

According to another embodiment of the present invention, a semiconductor array substrate unit structure is provided. Each unit structure has at least one switch region and at least one capacitor region disposed on a substrate. The unit structure comprises a gate electrode, a first electrode, a gate dielectric layer, a semiconductor layer, source/drain electrodes, a passivation layer, a second electrode, a protection layer and a pixel electrode. The gate electrode is disposed on the switch region, and the first electrode is disposed on the capacitor region. The gate dielectric layer covers the gate electrode, the first electrode and the substrate. The semiconductor layer is disposed on the gate dielectric layer above the gate electrode. The semiconductor layer has a channel region disposed above the gate electrode and source/drain regions disposed at both sides of the channel region. The source/drain electrodes are disposed on the source/drain regions of the semiconductor layer. The second electrode is disposed on the gate dielectric layer above the first electrode. The passivation layer covers the surface of the source/drain electrodes and the surface of the second electrode. The protection layer covers the passivation layer, the semiconductor layer, and the gate dielectric layer. The pixel electrode is disposed on a portion of the protection layer, and electrically connected to one of the source/drain electrodes and the second electrode.

Since the aforementioned TFT has a passivation layer, the source/drain electrodes are isolated from the gas used in the subsequent depositing of the protection layer. In this way, the barrier layer can be prevented from being reduced and damaged in the subsequent processes, thus achieving the effect of protecting the copper electrodes and alleviating the peeling of the copper film of the source/drain electrodes.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
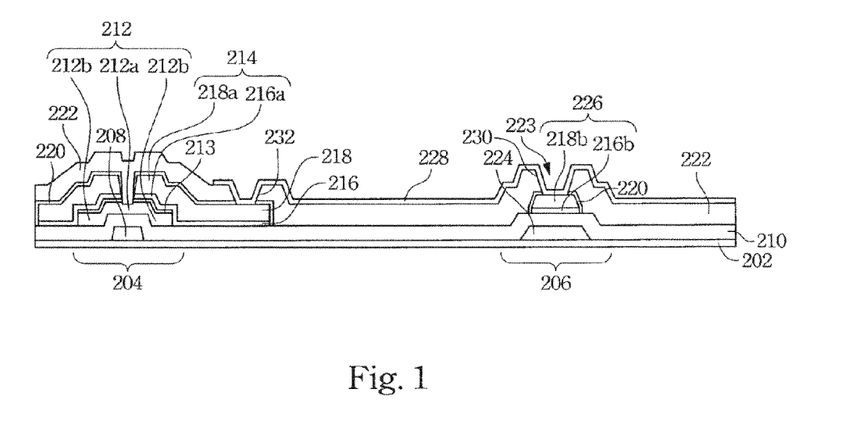
FIG. 1 is a schematic diagram illustrating a part section of a semiconductor array substrate of a liquid crystal display according to one embodiment of the present invention.

FIG. 1 is a schematic diagram illustrating a part cross-sectional view of a semiconductor array substrate of a flat panel display (e.g., a liquid crystal display) according to one embodiment of the present invention. As shown in FIG. 1, a substrate 202 has a switch region 204 and a capacitor region 206. A gate electrode 208 is disposed on the switch region 204 of the substrate 202. A gate dielectric layer 210 covers the gate electrode 208 and the substrate 202. The gate dielectric layer 210 above the gate electrode 208 has a patterned semiconductor layer 212 thereon, wherein the patterned semiconductor layer 212 has a channel region 212a disposed over the gate electrode 208 and source/drain regions 212b disposed at both sides of the channel region 212a. In addition, source/drain electrodes 214 are disposed on the source/drain regions 212b of the patterned semiconductor layer 212. The source/drain electrodes 214 comprise a barrier layer 216a and a conductive layer 218a, wherein the barrier layer 216a is disposed on the patterned semiconductor layer 212 and the gate dielectric layer 210, and the conductive layer 218a is disposed on the barrier layer 216a. A passivation layer 220 is disposed on the surface of the source/drain electrodes 214. A protection layer 222 covers the passivation layer 220 and the patterned semiconductor layer 212.

Still referring to FIG. 1, the capacitor region 206 of the substrate 202 has a storage capacitor 223 thereon. The storage capacitor 223 has a first electrode 224 and a second electrode 226, wherein the first electrode 224 is formed on the substrate and covered by the gate dielectric layer 210, and the second electrode 226 is disposed on the gate dielectric layer 210 above the first electrode 224. The second electrode 226 comprises a barrier layer 216b and a conductive layer 218b. The barrier layer 216b is disposed on the gate dielectric layer 210, whereas the conductive layer 218b is disposed on the barrier layer 216b. In addition, the passivation layer 220 may be disposed at the sidewall of the second electrode 226 and optionally over the second electrode 226. A protection layer 222 covers the second electrode 226 and the gate dielectric layer 210 of the capacitor region 206.

Additionally, a pixel electrode layer 228 is disposed on the protection layer 222. The pixel electrode layer 228 is electrically connected to one of the source/drain electrodes 214 through at least one contact window (or contact hole) 232 in the protection layer 222, and is electrically connected to the second electrode 226 through at least one aperture 230 of the protection layer 222.

Figure 2A:
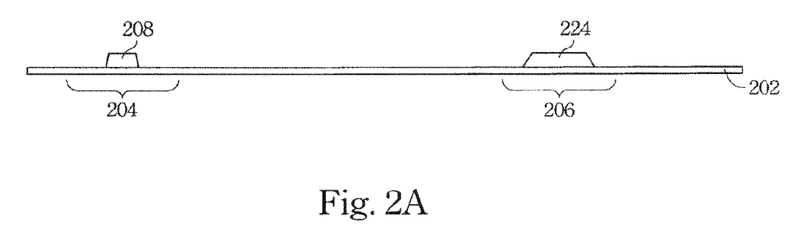
FIGS. 2A-2F are schematic diagrams illustrating the semiconductor array substrate of FIG. 1 at each processing stage.

Next, please refer to FIGS. 2A-2F. FIGS. 2A-2F are schematic diagrams illustrating the semiconductor array substrate of FIG. 1 at each processing stage. As shown in FIG. 2A, the substrate 202 is provided. The substrate 202 has a switch region 204 and a capacitor region 206. Next, a first conductive layer (not shown) is formed on the substrate 202. The first conductive layer is then patterned, thereby respectively forming a gate electrode 208 and a first electrode 224 on the switch region 204 and the capacitor region 206 of the substrate 202. Generally, the substrate 202 is a transparent substrate, such as a glass substrate or a plastic substrate.

Figure 2B:
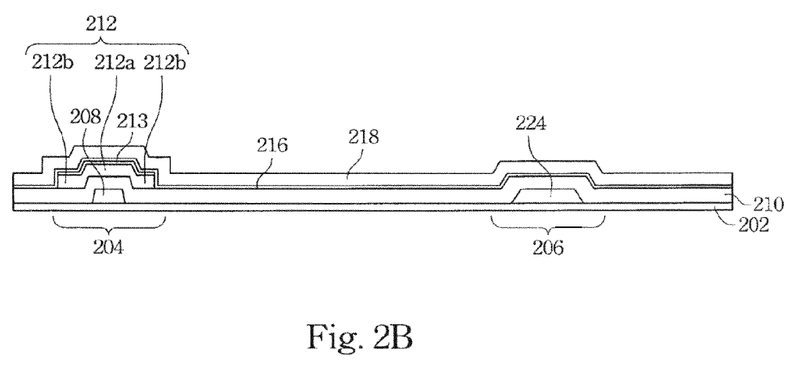

In FIG. 2B, a gate dielectric layer 210, a semiconductor layer (not shown) and a doped semiconductor layer (not shown) are sequentially formed over the gate electrode 208, the first electrode 224 and the substrate 202. The material of the gate dielectric layer 210 may be a single layer or a composite layer of silicon nitride, silicon oxide, or silicon oxynitride, and the thickness of the gate dielectric layer 210 is about 2000-5000 angstrom. The material of the semiconductor layer may be a single layer or a composite layer of amorphous silicon, microcrystalline silicon, or polycrystalline silicon, and the thickness of the semiconductor layer is about 1000-3000 angstrom. The material of the doped semiconductor layer may be N-type doped amorphous silicon, N-type doped microcrystalline silicon, or N-type doped polycrystalline silicon, and the thickness of the doped semiconductor layer is about 100-500 angstrom. Thereafter, the semiconductor layer and the doped semiconductor layer are patterned, thereby forming a patterned semiconductor layer 212 and a patterned doped semiconductor layer 213 on the gate dielectric layer 210 above the gate electrode 208. The patterned semiconductor layer 212 has a channel region 212a disposed above the gate electrode 208, and source/drain regions 212b (including a source region and a drain region) disposed at both sides of the channel region 212a. Then, a first material layer 216 and a conductive layer 218 are sequentially formed over the patterned semiconductor layer 212 and the gate dielectric layer 210. In the process described in the following paragraphs, the first material layer 216 and the conductive layer 218 further form source/drain electrodes (including a source electrode and a drain electrode) and a second electrode of the storage capacitor 223. The material of the first material layer 216 may be copper oxide or copper oxynitride, or may also be a copper alloy oxide or copper alloy oxynitride alloyed with a solid solution of molybdenum, titanium, tantalum, chromium, tungsten, nickel, magnesium, zirconium, manganese, or niobium. The material of the conductive layer 218 may be copper (copper metal), aluminum, or alloys thereof.

Figure 2C:
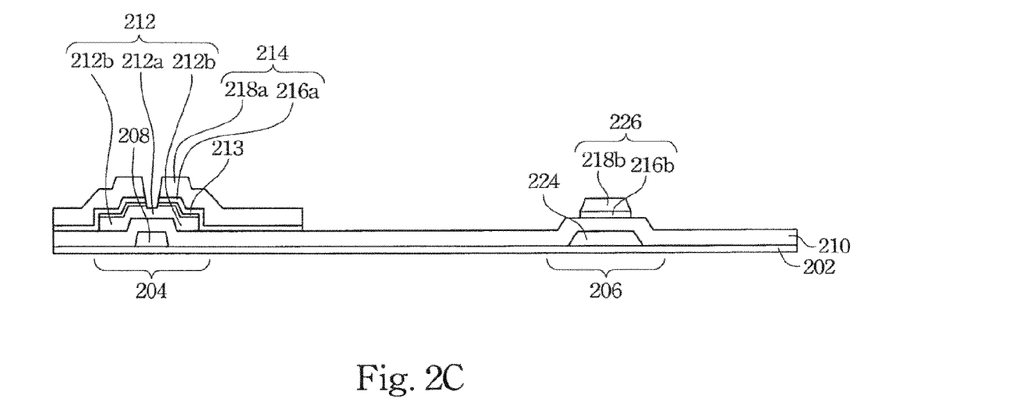

Referring to FIG. 2C, next, the first material layer 216 and the conductive layer 218 are patterned, thereby respectively forming a barrier layer and a conductive layer. The patterned barrier layer and conductive layer may be divided into a first portion and a second portion, wherein the first portion of the barrier layer 216a and the first portion of the conductive layer 218a are disposed on the source/drain regions 212b of the patterned semiconductor layer 212 above the gate electrode 208 and on a portion of the gate dielectric layer near the patterned semiconductor to form the source/drain electrodes 214. The second portion of the barrier layer 216b and the second portion of the conductive layer 218b are disposed on a portion of the gate dielectric layer 210 above the first electrode 224 to form the second electrode 226 of the storage capacitor 223.

The barrier layer 216a of the source/drain electrodes 214 is mainly used to prevent the copper metal in the conductive layer 218a from directly contacting with either the gate dielectric layer 210 or the patterned semiconductor layer 212 therebelow. Therefore, the copper metal of the conductive layer 218a reacting with the silicon of the patterned semiconductor layer 212 therebelow to form copper silicide is eliminated and thus the electrical degradation of the TFT is avoided. At the same time, the adhesion between the source/drain electrodes 214 and the gate dielectric layer 210 or the patterned semiconductor layer 212 below can be improved.

Figure 2D:
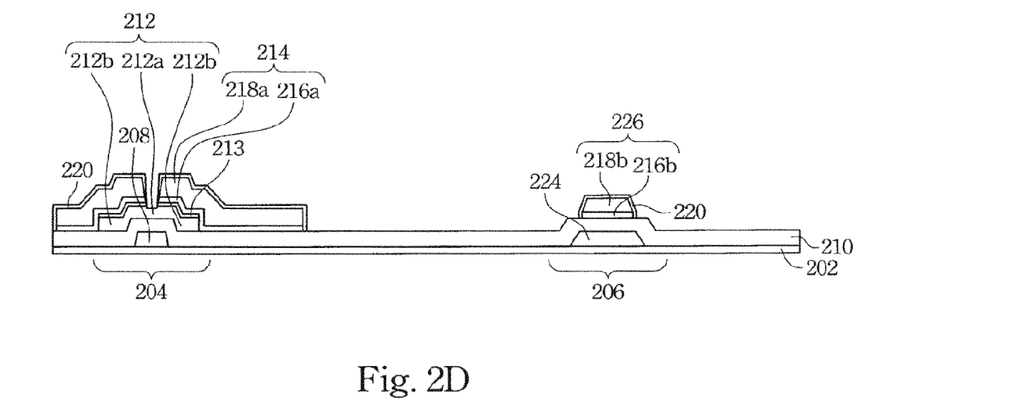

Referring to FIG. 2D, next, the source/drain electrodes 214 is treated by using nitrogen-containing plasma to form the passivation layer 220 on the surface of the conductive layer 218a and the barrier layer 216a of the source/drain electrodes 214. In the this step, the gas used in the nitrogen-containing plasma comprises at least a nitrogen-containing gas, such as, nitrogen, nitrogen dioxide, nitric oxide, or nitrous oxide. After the source/drain electrodes 214 is treated by the nitrogen-containing plasma, the surface of the conductive layer 218a and the barrier layer 216a of the source/drain electrodes 214 react with the nitrogen-containing gas and form a passivation layer 220 on the surface, wherein the passivation layer 220 includes copper nitride, copper alloy nitride, nitrogen doped copper, or nitrogen doped copper alloy. The thickness of the passivation layer 220 is in the range of about 5-200 angstrom. Moreover, in the aforementioned step, the passivation layer 220 may optionally form on the surface of the conductive layer 218b and the barrier layer 216b of the second electrode 226. By forming the passivation layer 220, the passivation layer 220 can efficiently protect the source/drain electrodes 214 and the second electrode 226 thereby preventing the barrier layer 216a of the source/drain electrodes 214 and the barrier layer 216b of the second electrode 226 from being reduced and producing bubbles during the subsequent manufacturing of the protection layer 222.

In this embodiment, other than preventing the barrier layers 216a and 216b from being reduced as mentioned before, the passivation layer 220 can also facilitate the re-crystallization of the silicon in the semiconductor layer 212 when annealing. During the aforementioned step of forming the source/drain electrodes 214, the first material layer 216 and the conductive layer 218 must be patterned. However, during the patterning process, the channel region 212a of the semiconductor layer is etched, thus resulting in damage of the silicon layer. Therefore, annealing must be carried out to achieve re-crystallization. When forming the passivation layer 220 with the nitrogen-containing plasma a small amount of nitrogen gas enters the patterned semiconductor layer 212. The nitrogen gas in the patterned semiconductor layer 212 facilitates the re-crystallization of the silicon of the semiconductor layer 212 during annealing, thus the crystals can be restored, thereby increasing the stability of the patterned semiconductor layer 212.

Figure 2E:
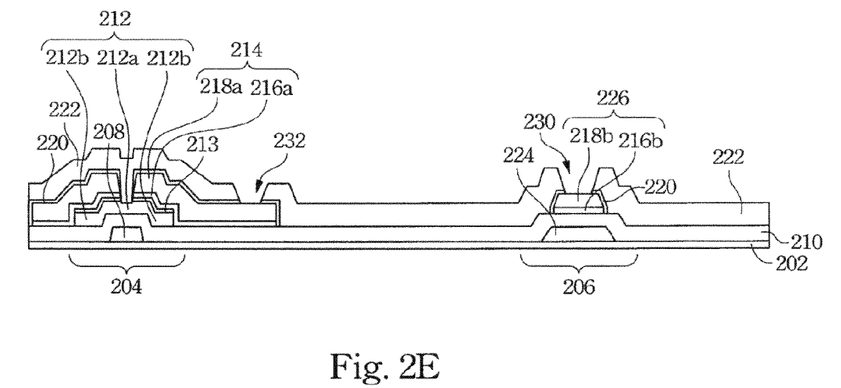

Next, as shown in FIG. 2E, the protection layer 222 is formed over the substrate 202 to cover all the elements. The material of the protection layer 222 may be a single layer or a composite layer of silicon nitride, silicon oxide, silicon oxynitride, or an organic polymer. Then, the protection layer 222 is patterned to form the contact window 232 in the protection layer 222 of the switch region 204, thereby exposing a portion of the source/drain electrodes 214. After being patterned, an aperture 230 is formed in the protection layer 222 of the capacitor region 206, thereby exposing the conductive layer 218b of the second electrode 226.

Figure 2F:
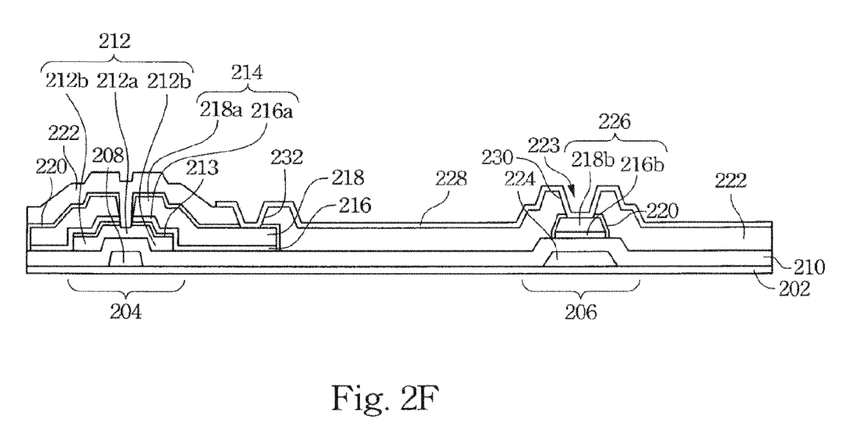

Finally, as shown in FIG. 2F, the pixel electrode layer 228 is formed on the protection layer 222 to be used as a pixel electrode. The pixel electrode layer 228 fills into the contact window 232 and the aperture 230, and electrically connects to one of the source/drain electrodes 214 and the second electrode 226.

Peeling Tests

A peeling test was conducted so as to find out whether or not the source/drain electrodes treated by the nitrogen-containing plasma according to embodiments of the present invention can efficiently prevent the barrier layer from being reduced and forming bubbles. In the conventional TFT, the source/drain structure included only a copper oxide barrier layer and a copper conductive layer. However, in the TFT of the embodiments of the present invention, the source/drain electrodes were treated with the nitrogen-containing plasma, therefore, an additional passivation layer was formed over the surface of the copper conductive layer and the copper oxide barrier layer. The results are shown in FIGS. 3A-3D.

Figure 3A:
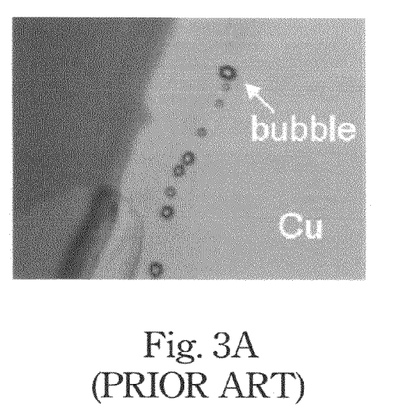
FIGS. 3A-3B are optical photomicrographs illustrating the conductive layer and barrier layer of the conventional source/drain electrodes that are not processed by a nitrogen-containing plasma.
Figure 3B:
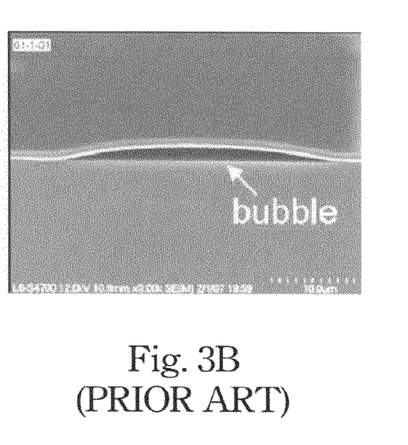

FIGS. 3A-3B are optical photomicrographs illustrating the conductive layer and barrier layer of the conventional source/drain electrode that are not treated by a nitrogen-containing plasma. As shown in FIG. 3A, the conventional source/drain structure is not treated by the nitrogen-containing plasma. In the subsequent PECVD process for depositing the silicon nitride protection layer, the copper oxide barrier layer is reduced by the reactive gasses such as ammonia and silane, thereby producing bubbles. As shown in FIG. 3B, the formation of bubbles causes peeling on the contact interface between the source/drain electrode and the substrate.

Figure 3C:
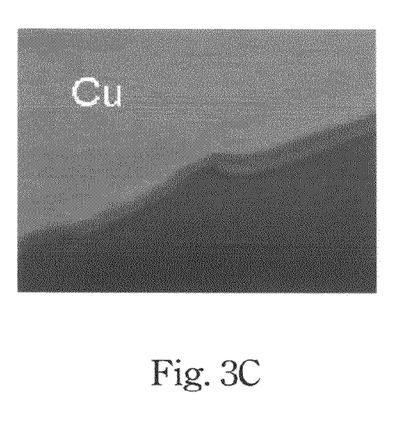
FIGS. 3C-3D are optical photomicrographs illustrating the conductive layer and barrier layer of the source/drain electrode that are pre-processed by a nitrogen-containing plasma according to one embodiment of the present invention.
Figure 3D:
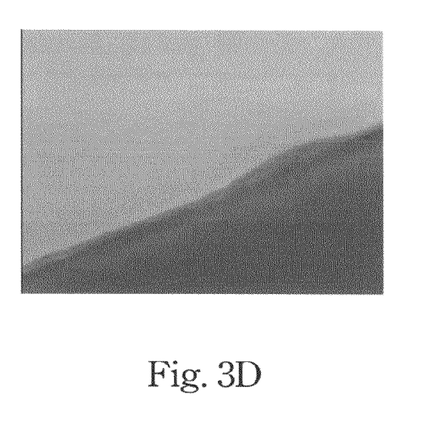

FIGS. 3C-3D are optical photomicrographs illustrating the conductive layer and barrier layer of the source/drain electrode that are pre-treated by a nitrogen-containing plasma for 15 seconds according to one embodiment of the present invention. As shown in FIGS. 3C-3D, after being treated by the nitrogen-containing plasma, the copper surface is devoid of any bubbles. Moreover, the contact interface between the source/drain electrode and the substrate is devoid of any signs of peeling. Accordingly, the nitride passivation layer formed on the surface of the conductive layer and barrier layer can actually isolate the reactive gases in the subsequent process of the protection layer, prevent bubbles from forming, provide complete protection of the source/drain, and greatly reduce peeling.

In view of the foregoing description, the method according to the embodiments of the present invention could be integrated in current manufacturing process without significantly altering the conventional manufacturing process. In addition, the passivation layer formed thereby can reliably prevent copper electrodes from being damaged in subsequent processes, and can significantly increase process yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appending claims.

What is claimed is:

1. A thin film transistor disposed on a substrate, comprising:
    a gate electrode disposed on the substrate;
    a gate dielectric layer covering the gate electrode and the substrate;
    a patterned semiconductor layer disposed on the gate dielectric layer over the gate electrode, having a channel region disposed over the gate electrode and source/drain regions disposed at both sides of the channel region;
    source/drain electrodes disposed on the source/drain regions of the patterned semiconductor layer, the source/drain electrodes comprising a stack of a patterned barrier layer and a patterned metal conductive layer, the patterned barrier layer being disposed on the source/drain regions of the patterned semiconductor layer, the patterned metal conductive layer being disposed on the patterned barrier layer and in contact with the patterned barrier layer;
    a passivation layer made of a material consisting essentially of a metal nitride, the passivation layer covering a top surface of the patterned metal conductive layer, wherein the passivation layer has a thickness of 5-200 angstrom; and
    a protection layer covering the passivation layer, the channel region of the semiconductor layer, and the substrate.

2. The thin film transistor according to claim 1, wherein a material of the patterned semiconductor layer comprises amorphous silicon, microcrystalline silicon, or polycrystalline silicon.

3. The thin film transistor according to claim 1, further comprising a patterned doped semiconductor layer disposed between the patterned semiconductor layer and the patterned barrier layer.

4. The thin film transistor according to claim 3, wherein a material of the patterned doped semiconductor layer comprises N-type doped amorphous silicon, N-type doped microcrystalline silicon, or N-type doped polycrystalline silicon.

5. The thin film transistor according to claim 1, wherein a material of the barrier layer comprises copper oxide, copper oxynitride, copper alloy oxide, or copper alloy oxynitride.

6. The thin film transistor according to claim 1, wherein a material of the patterned metal conductive layer comprises copper, aluminum, or alloys thereof.

7. The thin film transistor according to claim 1, wherein the material consisting essentially of the metal nitride comprises copper nitride, copper alloy nitride, nitrogen doped copper, or nitrogen doped copper alloy.

8. A unit structure of a semiconductor array substrate unit, each unit structure having at least a switch region and at least a capacitor region disposed on a substrate, the unit structure comprises:
   a gate electrode disposed on the switch region;
   a first electrode disposed on the capacitor region;
   a gate dielectric layer covering the gate electrode, the first electrode and the substrate;
   a patterned semiconductor layer disposed on the gate dielectric layer over the gate electrode, having a channel region disposed over the gate electrode and source/drain regions at both sides of the channel region;
   source/drain electrodes disposed on the source/drain regions of the patterned semiconductor layer, the source/drain electrodes comprising a stack of a patterned barrier layer and a patterned metal conductive layer, the patterned barrier layer being disposed on the source/drain regions of the patterned semiconductor layer, the patterned metal conductive layer being disposed on the patterned barrier layer and in contact with the patterned barrier layer;
   a second electrode disposed on the gate dielectric layer over the first electrode;
   a passivation layer made of a material consisting essentially of a metal nitride, the passivation layer covering a top surface of the source/drain electrodes and a surface of the second electrode, wherein the passivation layer has a thickness of 5-200 angstrom;
   a protection layer covering the passivation layer, the semiconductor layer, and the gate dielectric layer; and
   a pixel electrode disposed on a portion of the protection layer, wherein the pixel electrode electrically connected to one of the source/drain electrodes and the second electrode.

* * * * *